United States Patent [19]

Taylor

[11] Patent Number: 5,087,836
[45] Date of Patent: Feb. 11, 1992

[54] ELECTRONIC CIRCUIT INCLUDING A PARALLEL COMBINATION OF AN E-FET AND A D-FET

[75] Inventor: Stewart S. Taylor, Beaverton, Oreg.

[73] Assignee: TriQuint Semiconductor, Inc., Beaverton, Oreg.

[21] Appl. No.: 561,499

[22] Filed: Jul. 30, 1990

Related U.S. Application Data

[63] Continuation of Ser. No. 317,702, Feb. 28, 1989, abandoned.

[51] Int. Cl.[5] .................. H03K 19/094; H03K 19/084
[52] U.S. Cl. .................................... 307/450; 307/448; 307/457; 307/546
[58] Field of Search ............... 307/443, 448, 450, 451, 307/457, 546, 549

[56] References Cited

U.S. PATENT DOCUMENTS

| | | | |
|---|---|---|---|
| 3,995,172 | 11/1976 | Freeman et al. | 307/450 |
| 4,069,427 | 1/1978 | Masuda | 307/450 |
| 4,798,978 | 1/1989 | Lee et al. | 307/443 |
| 4,937,474 | 6/1990 | Sitch | 307/450 |

Primary Examiner—John S. Heyman
Assistant Examiner—Margaret Rose Wambach
Attorney, Agent, or Firm—Dellett, Smith-Hill and Bedell

[57] ABSTRACT

A class AB amplifier comprises a pull-up structure of an E-FET and D-FET connected in parallel and a pull-down structure of an E-FET and D-FET connected in parallel. Use of the E-FETs allows a high peak current to be achieved without increasing the quiescent current to an undesirable level. The pull-up structure and the pull-down structure are driven by currents that are out-of-phase, and accordingly linear push-pull operation is provided.

32 Claims, 2 Drawing Sheets

ELECTRONIC CIRCUIT INCLUDING A PARALLEL COMBINATION OF AN E-FET AND A D-FET

This is a continuation of application Ser. No. 07/317,702, filed Feb. 28, 1989 and now abandoned.

BACKGROUND OF THE INVENTION

This invention relates to an electronic circuit comprising field effect transistors (FETs).

An n-channel FET may be fabricated on a die or in a well of p-type semiconductor material by implanting an n-type dopant into source and drain regions of the FET. An n-type dopant may also be implanted, at a lower concentration, into a channel region between the source and drain regions to form a depletion (normally on) FET. Source and drain electrodes are formed in ohmic contact with the source and drain regions respectively, and a gate electrode is deposited over the channel region. In a metal-semiconductor FET, or MESFET, the gate electrode is deposited directly onto the channel region, and a rectifying junction is established between the gate electrode and the channel region, whereas in a metal-oxide-semiconductor FET, or MOSFET, the gate electrode is insulated from the channel region. The drain electrode and the source electrode are connected to positive and negative potential levels respectively. When the gate to source voltage (Vgs) exceeds a threshold level known as the pinch-off voltage (Vp), current is able to flow from the drain region to the source region through the channel region when the drain to source voltage (Vds) is sufficiently large.

A p-channel FET is similar to an n-channel FET, except that the die or well is of n-type conductivity and the implantations that are used to form the source, drain and channel (for a depletion FET) regions are of a p-type dopant.

The quiescent current (Idss) of a FET is the current that flows from drain to source when Vgs is zero and Vds is sufficiently large. FETs are classified as enhancement mode or depletion mode depending on the value of Idss: for an enhancement mode FET (E-FET) Idss is zero, and for a depletion mode FET (D-FET) Idss is positive.

FIG. 1 illustrates a simple D-FET source follower circuit which may be implemented using, for example, gallium arsenide MESFET technology. If the two transistors Q1 and Q2 are the same size, so that dss is the same for each transistor and Vgs1 (Vgs for the transistor Q1) is zero, no current is delivered to the load when Vin is zero. As Vin increases, Vgs1 also increases and current is delivered to the load. As Vgs1 increases, the output current increases until Vgs1 reaches a maximum value equal to a diode on voltage, which is about 0.7 v in the case of a GaAs device.

It can be shown that the maximum drain current that can be delivered by the transistor Q1 in the circuit shown in FIG. 1 is about four times the quiescent current of the transistor for a pinch-off voltage of about −0.6 v. Thus, the maximum load current is about three times the quiescent current, since the transistor Q2 also draws the quiescent current. Therefore, if a peak load current of 15 mA is required, corresponding to a maximum drain current of 20 mA, Idss must be at least 5 mA. It is desirable that the quiescent current be as small as possible, in order to minimize the power consumption of the circuit.

A push-pull amplifier can be constructed using two D-FETs, one of which supplies positive current to the load in response to positive signal excursions and the other of which sinks negative current from the load in response to negative signal excursions. When Vgs for one D-FET increases, Vgs for the other D-FET decreases, and vice versa.

SUMMARY OF THE INVENTION

A preferred embodiment of the invention in a first aspect is an electronic circuit having an input terminal and an output terminal and comprising an E-FET and a D-FET, each having first, second and third electrodes, of which the first electrode is a gate, one of the second and third electrodes is a source, and the other of the second and third electrodes is a drain, and the circuit also comprising means connecting the gate of the E-FET to the gate of the D-FET and maintaining a predetermined voltage bias therebetween, means connecting the second electrode of the E-FET to the second electrode of the D-FET and maintaining a predetermined voltage bias therebetween, means connecting the third electrode of the E-FET to the third electrode of the D-FET and maintaining a predetermined voltage bias therebetween, and means connecting the output terminal to the source or drain of the D-FET and maintaining a predetermined voltage bias between the output terminal and the source or drain of the D-FET, the input terminal being connected to the gate of the D-FET.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
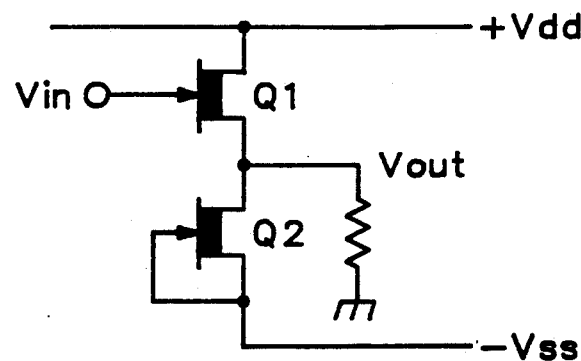
FIG. 1 is a schematic of a conventional source follower.
Figure 2:
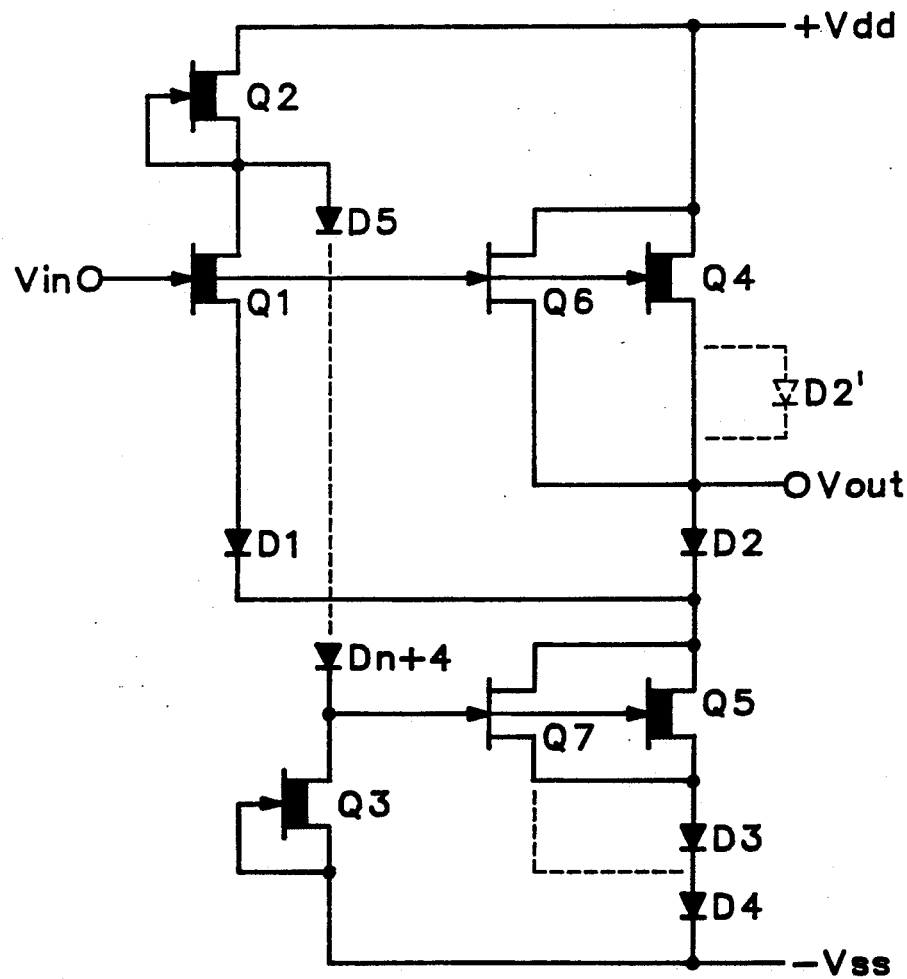
FIG. 2 is a schematic of a first class AB amplifier output stage embodying the present invention.

The amplifier output stage shown in FIG. 2 is a push-pull amplifier having an input terminal at which it receives a signal having a voltage Vin that may have positive and negative excursions from a reference potential level and an output terminal at which it develops an output signal having a voltage Vout. The input terminal is connected to the gates of two D-FETs Q1 and Q4 and the gate of an E-FET Q6 and the output terminal is connected to the sources of the FETs Q4 and Q6. The drain of the D-FET Q1 is connected through a current source D-FET Q2 to the positive power supply rail Vdd and through a diode level shifter D5 ... Dn+4 and a current source D-FET Q3 to the negative power supply rail Vss. The drain of the D-FET Q3 is connected to the gate of a D-FET Q5 and the gate of an E-FET Q7. The source of the D-FET Q1 is connected through a diode D1 to the drains of the FETs Q5 and Q7, and the sources of the FETs Q4 and Q6 are connected through a diode D2 to the drains of the FETs Q5 and Q7. The sources of the FETs Q5 and Q7 are connected through diodes D3 and D4 to the negative power supply rail Vss.

The transistors Q2 and Q3 are chosen such that Id2 (the drain current of the transistor Q2) is greater than Id3, typically twice Id3. The transistors Q1, Q2, Q3, Q5 and Q7 and the level shifter form a negative feedback loop forcing Id1=Id2-Id3. The source current for the transistor Q1 is supplied by the transistor Q5. The loop formed by the transistors Q1 and Q4 and the diodes D1 and D2 establishes the quiescent current in the transistors Q4 and Q5 when Vout is 0 v. If the width of a device is represented by W, and WQ4/WQ1 is equal to WD2/WD1, then Id4=(WQ4/WQ1)*Id1 when Vout is 0 v. The relative sizes of Q1, Q2 and Q3 establish Vgs1, which is typically chosen to be 0 v.

The transistors Q1 and Q2 amplify the input signal received at the input terminal to control the transistors Q5 and Q7 through the level shifter and the transistor Q3. The number of diodes, N, in the level shifter is chosen to keep the transistors Q1 and Q2 operating in saturation, given the power supply voltages Vdd and Vss, and also to permit a reasonable positive output swing.

Since the transistors Q6 and Q7 are E-FETs, their quiescent current is zero and therefore they do not contribute to the power consumed by the FIG. 2 circuit when Vgs1 is less than the threshold voltage of the E-FETs. The transistor Q4 supplies positive current to the output terminal for positive outputs, whereas the transistor Q5 sinks negative current from the load for negative outputs. If the load impedance is low, and Vin increases, Is4 (the source current of the transistor Q4) remains substantially constant while Id5 decreases. The current through the diode D2 and the current Id3 decrease. When the load current becomes sufficiently large, the diode D2 stops conducting, Vgs4 increases, and the entire drain current of the transistor Q4 is supplied to the load. When Vgs4 becomes sufficiently forward biased, the transistor Q6 starts to conduct, providing additional load current beyond that of the transistor Q4. Id5 is never reduced to zero because the transistor Q5 supplies the quiescent current (equal to Id2-Id3) to the transistor Q1.

If Vin becomes negative, Id6 is zero while Id4 remains substantially constant and Id5 increases. When Vgs7 becomes positive, the transistor Q7 will begin to conduct and will provide additional load current beyond that of the transistor Q5. When the transistor Q7 turns on, the sum of the drain currents drawn by the transistors Q5 and Q7 is taken from the load. The circuit shown in FIG. 2 therefore has a small quiescent current but is able to deliver a large positive or negative peak current when required. In this manner, the parallel combination of an E-FET and a D-FET (Q4, Q6 and Q5, Q7) extend the maximum output current of this class AB amplifier.

In a modification of the FIG. 2 circuit, shown in dashed lines in FIG. 2, a diode D2' is connected between the sources of the transistors Q4 and Q6. The transistor Q6 is then biased at the edge of conduction so that any increase in Vin will cause source current to flow in Q6 and contribute to the output current. The modified circuit therefore provides improved linearity. Similarly, the dashed line connection of the source of the transistor Q7 to the cathode of the diode D3 places Q7 at the edge of conduction.

Figure 3:
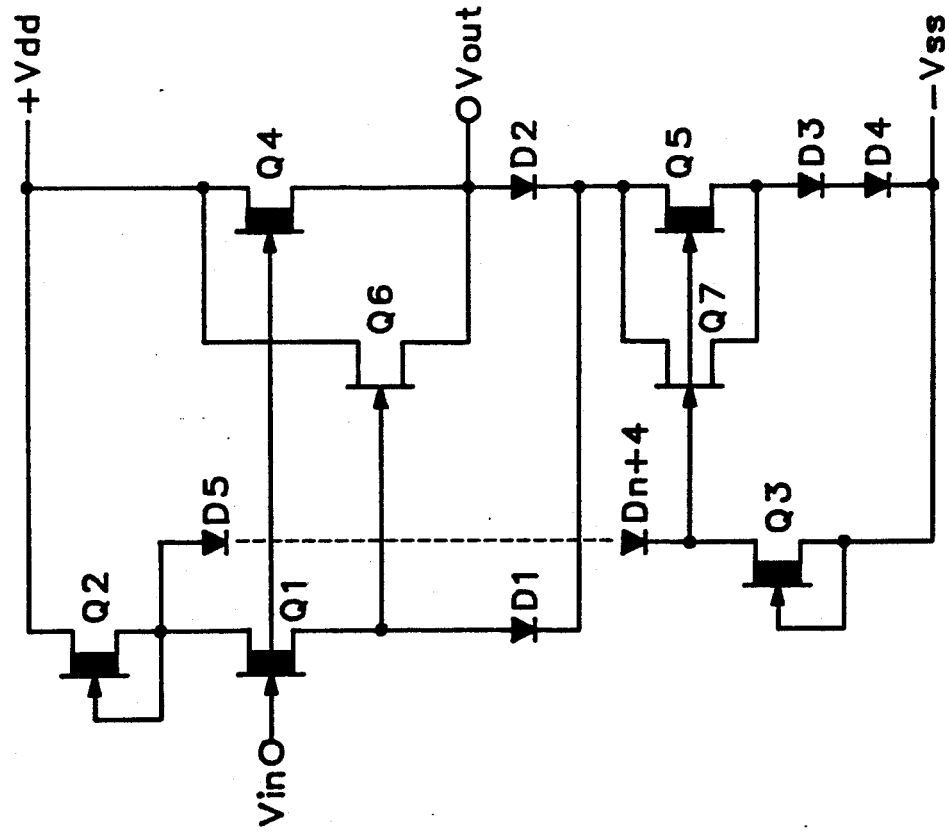
FIG. 3 is a schematic of a second class AB amplifier output stage embodying the present invention.

In the case of the FIG. 3 circuit, the gate of the E-FET Q6 is not connected to the gate of the D-FET Q4 but is connected to the source of the D-FET Q1. By selecting the current densities in the diodes D1 and D2, the voltage drop across D1 may be made greater than that across D2, so that the transistor Q6 is biased at the edge of conduction.

Figure 4:
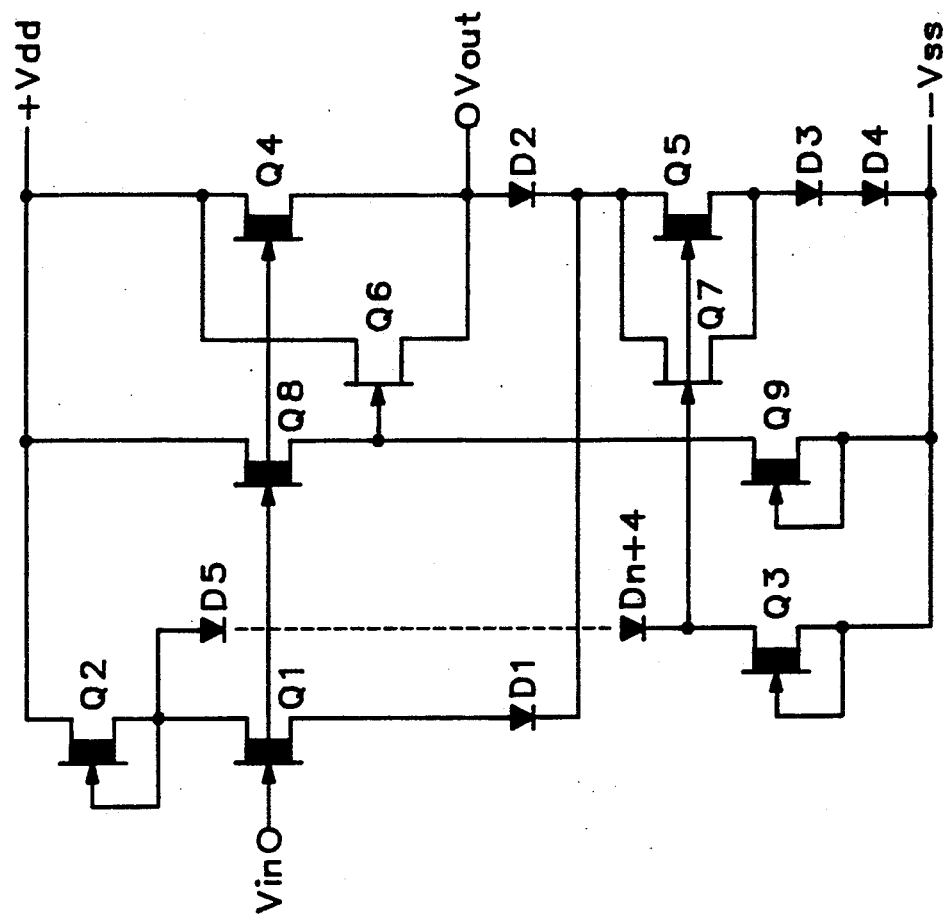
FIG. 4 illustrates a modification of the FIG. 3 circuit.

In a modification (not shown) of the FIG. 3 circuit, a diode is connected in series with the diode D1 in order to increase Vgs6 and set the bias point of the transistor Q6 at a greater level of conduction. A similar effect may be achieved by selecting an appropriate value for the ratio WD1:WD2. In a further modification, shown in FIG. 4, a separate source follower Q8 is used to establish the potential at the gate of the transistor Q6. The value of Vgs6 can then be set by selecting the relative sizes of the source follower Q8 and the pull-down D-FET Q9.

It will be appreciated that the present invention is not restricted to the particular embodiments that have been described and illustrated, and that variations may be made therein without departing from the scope of the invention as defined in the appended claims and equivalents thereof. For example, although the invention has been described in the context of GaAs FETs, it is applicable to field effect transistors fabricated using other materials than gallium arsenide, and requires only that both enhancement mode and depletion mode transistors can be fabricated. Although the circuits described with reference to FIGS. 2-4 employ n-channel devices, the invention may be implemented with p-channel devices also.

I claim:

1. An electronic circuit having an input terminal and an output terminal and comprising:
    a first E-FET and a first D-FET, each having a gate, a source, and a drain, the input terminal of the circuit being connected to the gate of the first D-FET,
    means connecting the gate of the first E-FET to the gate of the first D-FET,
    means connecting the source of the first E-FET to the source of the first D-FET,
    means connecting the drain of the first E-FET to the drain of the first D-FET,
    means connecting the output terminal to the source of the first D-FET,
    a second E-FET and a second D-FET, each having a gate, a source, and a drain,
    means connecting the gate of the second E-FET to the gate of the second D-FET,
    means connecting the source of the second E-FET to the source of the second D-FET,
    means connecting the drain of the second E-FET to the drain of the second D-FET, and
    means connecting the drain of the second D-FET to the source of the first D-FET.

2. A circuit according to claim 1, wherein the gate of the first E-FET is ohmically connected to the gate of the first D-FET.

3. A circuit according to claim 1, wherein the source of the first E-FET is ohmically connected to the source of the first D-FET.

4. A circuit according to claim 1, wherein the source of the first E-FET is connected to the source of the first D-FET through a diode.

5. A circuit according to claim 1, wherein the drain of the first E-FET is ohmically connected to the drain of the first D-FET.

6. A circuit according to claim 1, comprising a power supply rail, a third D-FET having a gate, a source, and a drain, means connecting the drain of the third D-FET to the power supply rail, and means connecting the source of the third D-FET to the drain of the second D-FET, and wherein the input terminal of the circuit is connected to the gate of the third D-FET.

7. A circuit according to claim 6, comprising a second power supply rail, means connecting the source of the second D-FET to the second power supply rail, and a diode level shifter and a current source connected in series between the drain of the third D-FET and the second second power supply rail.

8. A circuit according to claim 6, comprising a second power supply rail, a level shifter connected between the drain of the third D-FET and the gate of the second D-FET, means connecting the source of the second D-FET to the second power supply rail, and a current source connected between the gate of the second D-FET and the second power supply rail.

9. A circuit according to claim 6, wherein the means connecting the drain of the third D-FET to the power supply rail comprise a current source.

10. A circuit according to claim 1, wherein the output terminal is ohmically connected to the source of the first D-FET.

11. A circuit according to claim 1, wherein the source of the second E-FET is ohmically connected to the source of the second D-FET.

12. A circuit according to claim 1, wherein the drain of the second E-FET is ohmically connected to the drain of the second D-FET.

13. A circuit according to claim 1, wherein the source of the second E-FET is connected to the source of the second D-FET through a diode.

14. A circuit according to claim 1, wherein the source of the first D-FET is connected to the drain of the second D-FET through a diode.

15. A circuit according to claim 1, wherein the output terminal is connected to the source of the first D-FET through a diode.

16. A circuit according to claim 1, further comprising drive means connected to the gate of the first D-FET and the gate of the second D-FET for supplying respective drive signals to the first and second D-FETs.

17. A circuit according to claim 16, wherein the drive means comprise a third D-FET having its gate connected ohmically to the input terminal and the gate of the first D-FET, a first current source for supplying drain current to the third D-FET, a second current source connected to the gate of the second D-FET, a level shifter connected between the drain of the third D-FET and the gate of the second D-FET, and means connecting the source of the third D-FET to the drain of the second D-FET.

18. A circuit according to claim 17, wherein the current supplied by the first current source is about twice the current supplied by the second current source and the drain current of the third D-FET is equal to the difference between the current supplied by the first current source and the current supplied by the second current source.

19. An electronic circuit having first and second nodes and comprising an E-FET and first and second D-FETs, each having first, second and third electrodes, of which the first electrode is a gate, one of the second and third electrodes is a source, and the other of the second and third electrodes is a drain, and the circuit also comprising means connecting the second electrode of the E-FET and the second electrodes of the first and second D-FETs to said first node, means connecting the third electrode of the E-FET and the third electrodes of the first and second D-FETs to said second node, means connecting the gate of the first D-FET to the gate of the second D-FET, and means connecting the gate of the E-FET to the source of the second D-FET, the gate of the second D-FET not being ohmically connected to the source of the second D-FET.

20. A circuit according to claim 19, wherein the source of the E-FET is ohmically connected to the source of the D-FET.

21. A circuit according to claim 19, wherein the drain of the E-FET is ohmically connected to the drain of the first D-FET.

22. A circuit according to claim 19, wherein the drain of the E-FET is ohmically connected to the drain of the second D-FET.

23. A circuit according to claim 19, having an output terminal ohmically connected to the source of the first D-FET.

24. A circuit according to claim 19, having an input terminal connected to the gate of the second D-FET and an output terminal connected to the source of the first D-FET.

25. An electronic circuit having an input terminal and an output terminal and comprising an E-FET and a D-FET, each having a source, a gate and a drain, and the circuit also comprising means connecting the gate of the E-FET to the gate of the D-FET, a diode connecting the source of the E-FET to the source of the D-FET, means connecting the drain of the E-FET to the drain of the D-FET, and means connecting the output terminal to the source of the E-FET, the input terminal being connected to the gate of the D-FET.

26. A circuit according to claim 25, wherein the gate of the E-FET is ohmically connected to the gate of the D-FET.

27. A circuit according to claim 25, wherein the drain of the E-FET is ohmically connected to the drain of the D-FET.

28. A circuit according to claim 25, wherein the output terminal is connected ohmically to the source of the E-FET and the diode is connected between the source of the D-FET and the output terminal.

29. An electronic circuit having an input terminal and an output terminal and comprising an E-FET and a D-FET, each having first, second and third electrodes, of which the first electrode is a gate, one of the second and third electrodes is a source, and the other of the second and third electrodes is a drain, the gate of the D-FET not being ohmically connected to either the source or the drain of the D-FET, and the circuit also comprising means connecting the gate of the E-FET to the gate of the D-FET, means connecting the second electrode of the E-FET to the second electrode of the D-FET, means connecting the third electrode of the E-FET to the third electrode of the D-FET, and a diode connecting the output terminal to the source or drain of the D-FET.

30. A circuit according to claim 29, wherein the gate of the E-FET is ohmically connected to the gate of the D-FET.

31. A circuit according to claim 29, wherein the source of the E-FET is ohmically connected to the source of the D-FET.

32. A circuit according to claim 29, wherein the drain of the E-FET is ohmically connected to the drain of the D-FET.

* * * * *